United States Patent [19]

Naito et al.

[11] 4,219,832
[45] Aug. 26, 1980

[54] THYRISTOR HAVING LOW ON-STATE VOLTAGE WITH LOW AREAL DOPING EMITTER REGION

[75] Inventors: Masayoshi Naito; Takahiro Nagano; Takuzo Ogawa, all of Hitachi, Japan

[73] Assignee: Hitachi, Ltd., Japan

[21] Appl. No.: 716,280

[22] Filed: Aug. 20, 1976

[30] Foreign Application Priority Data

Sep. 3, 1975 [JP] Japan ................ 50-105989

[51] Int. Cl.$^2$ ............................ H01L 29/74
[52] U.S. Cl. ............................ 357/38; 357/30; 357/59; 357/86; 357/89; 357/90
[58] Field of Search ............. 357/30, 38, 59, 90, 357/89, 13, 86

[56] References Cited

U.S. PATENT DOCUMENTS

| | | | |
|---|---|---|---|
| 3,231,796 | 1/1966 | Shombert | 357/13 |
| 3,349,299 | 10/1967 | Herlet | 357/38 |
| 3,487,276 | 12/1969 | Wolley | 357/38 |
| 3,893,153 | 7/1975 | Page et al. | 357/38 |
| 3,967,981 | 7/1976 | Yamazaki | 357/59 |
| 3,990,091 | 11/1976 | Cresswell et al. | 357/38 |

Primary Examiner—Joseph E. Clawson, Jr.
Attorney, Agent, or Firm—Craig and Antonelli

[57] ABSTRACT

A thyristor comprising a four-layer semiconductor substrate of PNPN structure in which the sum of the thicknesses in the layered direction of the intermediate P-type and N-type layers is less than 400μ, and the amount of impurities per unit area of either one of the outer P-type and N-type layers is less than $3 \times 10^{14}$ atoms/cm$^2$.

11 Claims, 10 Drawing Figures

THYRISTOR HAVING LOW ON-STATE VOLTAGE WITH LOW AREAL DOPING EMITTER REGION

BACKGROUND OF THE INVENTION

This invention relates to a thyristor having a low on-state voltage.

Thyristors, as disclosed in U.S. Pat. No. 3,422,323 and U.S. Pat. No. Re. 27,440 for example, comprise generally a four-layer semiconductor substrate of PNPN structure consisting of continuously arranged layers of alternately different conductivity types forming a PN junction between each of the adjacent layers, a pair of main electrodes making ohmic contact with the outer P-type and N-type layers respectively of the semiconductor substrate, and trigger means for switching over the regions between the main electrodes from off-state to on-state. The operating function of the thyristor of this kind is such that the thyristor remains in the off-state so long as a forward voltage lower than a critical voltage called a forward break-over voltage is kept applied across the main electrodes, and switch-over from the off-state to the on-state takes place in response to the application of a trigger signal from the trigger means.

In the thyristor of the kind described above having such a switching function, the thyristor performance can be improved by decreasing the impedance of the regions between the main electrodes in the on-state, that is, by reducing the on-state voltage. Principal factors which determine this on-state voltage of the thyristor include the sum of the voltage across the PN junctions and the voltage drop in the intermediate P-type and N-type layers due to the resistance thereof. This voltage drop in the intermediate P-type and N-type layers due to the resistance thereof become less when the amount of carriers injected into the intermediate layers from the outer layers is greater, and the amount of carriers injected into the intermediate layers increases with the increase in the amount of impurities in the outer layers. Therefore, common practice has been such that the amount of impurities in the outer layers is sufficiently increased to reduce the voltage drop in the intermediate layers thereby reducing the on-state voltage of the thyristor. However, this increase in the amount of impurities in the outer layers gives rise to a reverse effect of corresponding increase in the voltage applied across the PN junctions. There has therefore been a limit to the desired reduction of the on-state voltage of the thyristor by the increase in the amount of impurities doped in the outer layers of the thyristor.

SUMMARY OF THE INVENTION

It is a primary object of the present invention to provide a novel thyristor of PNPN structure in which the voltage applied across the PN junctions is lowered without appreciably increasing the voltage drop in the intermediate P-type and N-type layers thereby providing an on-state voltage which is lower than hitherto.

The thyristor of the present invention which attains the above object is featured by the fact that the amount of impurities per unit area of either one of the outer P-type and N-type layers is greatly decreased compared with that of the other outer layer. More precisely, the thyristor according to the present invention is featured by the fact that the amount of impurities per unit area of one of the P-type and N-type outer layers is less than that of the other outer layer and is selected to be less than $3 \times 10^{14}$ atoms/cm$^2$ but more than the minimum required for ensuring the thyristor operation, and that the sum of the thicknesses of the intermediate P-type and N-type layers is selected to be less than 400μ.

Other objects and features of the present invention will become apparent from the following detailed description taken in conjunction with the accompanying drawings.

DESCRIPTION OF THE PREFERRED EMBODIMENTS

The present invention will now be described in detail with reference to the drawings. FIG. 1 is a schematic representation of distribution of carriers in a thyristor of PNPN structure in on-state, and the reference characters h and e designate holes and electrons respectively.

The concentrations of majority carriers in the P-type emitter layer $P_E$ and N-type emitter layer $N_E$ are respectively approximately equal to the concentrations of impurities in these layers $P_E$ and $N_E$. In the N-type base layer $N_B$ and P-type base layer $P_B$ into which the carriers are injected from the opposite emitter layers $P_E$ and $N_E$, the concentration of carriers is higher than that of impurities in each layer, and the concentration of electrons is equal to that of holes according to the condition of charge neutrality.

Figure 1A:
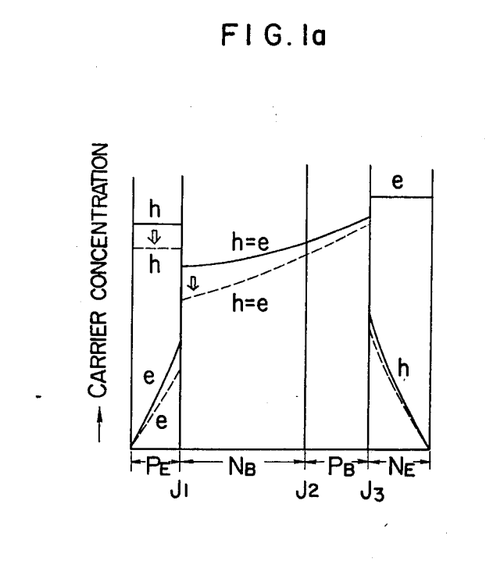
FIG. 1 is a schematic representation of distribution of carriers in a thyristor of PNPN structure in on-state.

The amount Q of impurities per unit area of the P-type emitter layer $P_E$ is given by the product of the impurity concentration $N_1$ and the thickness $W_1$ of the P-type emitter layer $P_E$. The reason why the on-state voltage of the thyristor structure can be reduced by decreasing the amount Q of impurities per unit area of the P-type emitter layer $P_E$, will be described with reference to FIG. 1. Decrease in the impurity concentration $N_1$ of the P-type emitter layer $P_E$ is followed by a corresponding decrease in the concentration of holes in this layer $P_E$, resulting in a corresponding decrease in the amount of carriers injected into the base layers. Thus, the distribution of carriers in the thyristor changes from that shown by the solid line to that shown by the dotted line as seen in FIG. 1a. This change in the carrier distribution results in a corresponding reduction in the voltage applied across the PN junction $J_1$ between the P-type emitter layer $P_E$ and the N-type base layer $N_B$.

Figure 1B:
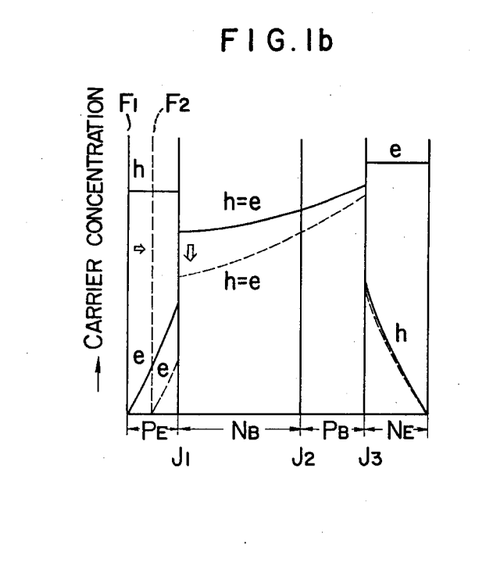

FIG. 1b illustrates the case in which one surface $F_1$ of the semiconductor substrate is displaced to $F_2$ to decrease the thickness $W_1$ of the P-type emitter layer $P_E$. No change occurs in the gradient of the minority carrier concentration in the P-type emitter layer $P_E$ unless the current density is changed. Therefore, the decrease in the thickness $W_1$ of the P-type emitter layer $P_E$ is followed by a corresponding decrease in the concentration of electrons in the area of the P-type emitter layer $P_E$ adjacent to the PN junction $J_1$, resulting in a corresponding decrease in the amount of carriers injected into the base layers. Thus, the distribution of carriers in the thyristor changes from that shown by the solid line to that shown by the dotted line as seen in FIG. 1b. Therefore, the voltage applied across the PN junction $J_1$ is reduced.

It will thus be seen that the voltage applied across the PN junction $J_1$ can be reduced by decreasing the impurity concentration $N_1$ or the thickness $W_1$ of the P-type emitter layer $P_E$. Since the amount Q of impurities per unit area of the P-type emitter layer $P_E$ is given by the product of the impurity concentration $N_1$ and the thickness $W_1$ of this layer $P_E$, the voltage applied across the PN junction $J_1$ can be reduced by decreasing the amount Q of impurities per unit area of the P-type emitter layer $P_E$. On the other hand, the decrease in the value of Q results in a corresponding decrease in the amount of carriers injected into the base layers, and a greater voltage drop occurs in the base layers. However, this decrease in the amount of carriers injected from the P-type emitter layer $P_E$ will not cause an appreciably great voltage drop in the base layers because sufficient carriers are injected from the N-type emitter layer $N_E$ when the amount of impurities per unit area of the N-type emitter layer $N_E$ is selected to be as large as that in conventional thyristors of this kind.

In fact, the inventors have found that the rate of reduction in the voltage across the junction due to the decrease in the value of Q is greater than the rate of increase in the voltage drop in the base layers when the total thickness of the base layers is selected to be less than a certain limit, and as a result thereof, the on-state voltage of the thyristor can be reduced. Further, the on-state voltage in this case is not dependent upon the amount of impurities per unit area of the N-type emitter layer $N_E$ provided that this amount is sufficiently large. Such a notable effect can be obtained due to the fact that the P-type emitter layer $P_E$ has a low carrier injection efficiency whereas the N-type emitter layer $N_E$ containing impurities in a sufficiently large amount per unit area has a high carrier injection efficiency, and the amount of injected carriers is controlled by the carrier injection efficiency of the P-type emitter layer $P_E$.

While the above description has referred to the case of decreasing the amount Q of impurities per unit area of the P-type emitter layer $P_E$, it is apparent that the effect is entirely the same in the contrary case in which the amount Q of impurities per unit area of the N-type emitter layer $N_E$ is decreased.

Figure 2:
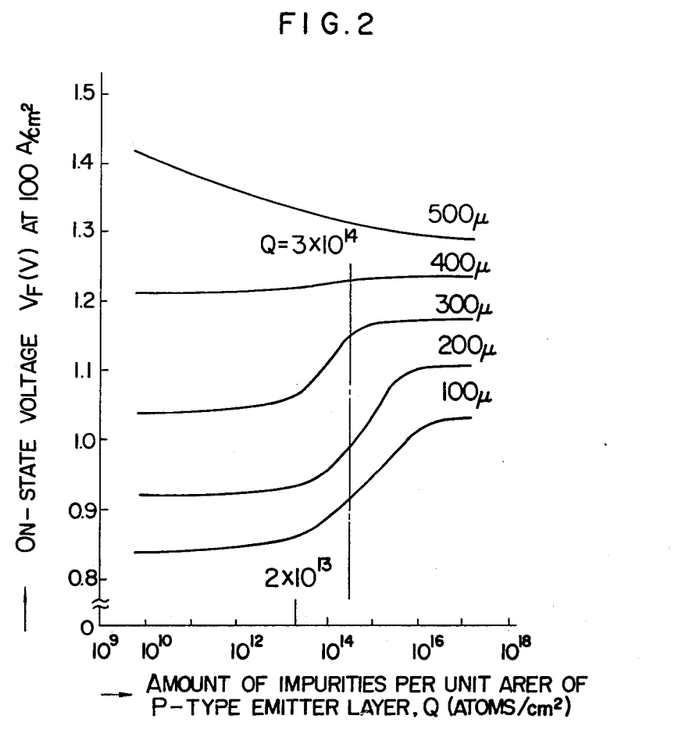
FIG. 2 is a graph showing the relation between the amount of impurities per unit area of one of the emitter layers and the forward voltage drop in the schematic thyristor structure shown in FIG. 1, with the total thickness of the base layers taken as a parameter.

Various numerical values are defined on the basis described below. Results of an experiment conducted by the inventors have proved that a relationship as shown in FIG. 2 exists between the amount Q (atoms/cm$^2$) of impurities per unit area of one of the emitter layers $P_E$ and $N_E$ and the on-state voltage $V_F$ (volts) when the sum of thicknesses ($\mu$) of the P-type and N-type base layers $P_B$ and $N_B$ is taken as a parameter. It will be seen from FIG. 2 that the on-state voltage $V_F$ starts to decrease at a certain value of the amount Q of the impurities per unit area of the emitter layer when the value of Q is decreased and the sum of the thicknesses of the two base layers is less than and including 400$\mu$, and the on-state voltage $V_F$ becomes approximately constant in spite of a further decrease in the value of Q. The value of Q which is decreased to provide the merit of the present invention should be less than $3 \times 10^{16}$ atoms/cm$^2$, $5 \times 10^{15}$ atoms/cm$^3$, $1 \times 10^{15}$ atoms/cm$^2$ and $3 \times 10^{14}$ atoms/cm$^2$ when the sum of the thicknesses of the two base layers is 100$\mu$, 200$\mu$, 300$\mu$ and 400$\mu$ respectively.

Therefore, thyristors exhibiting the notable effect of the present invention can be obtained when the sum of the thicknesses of the base layers is selected to be less than 400$\mu$ and the value of Q is selected to be less than $3 \times 10^{14}$ atoms/cm$^2$. When the value of Q is selected to be less than $2 \times 10^{13}$ atoms/cm$^2$, the rate of reduction in the voltage across the junction and the rate of increase in the voltage drop in the base layers cancel each other, and the on-state voltage of the thyristor is not substantially dependent upon the value of Q. In the thyristor fabricated to possess the value of Q falling within such range, the on-state voltage of the thyristor is not substantially affected by slight variations in the value of Q which might occur in the course of fabrication, and the desired thyristor characteristics can be obtained with improved reproducibility. It is therefore desirable that the value of Q be less than $2 \times 10^{13}$ atoms/cm$^2$.

A thyristor having an excessively small value of Q is undesirable in that the carrier injection efficiency of the emitter layer is extremely lowered resulting in impossibility of providing the current amplification factor required for switching over the thyristor to the on-state. In such a case, the thyristor is not turned on and does not act as a switching element. It is therefore necessary to set the minimum value of Q within the range of required thyristor performance. Although this minimum value of Q is dependent upon the sheet resistance of the base layer adjoining the emitter layer, the optimum minimum value of Q of the P-type emitter layer is $6 \times 10^9$ atoms/cm$^2$ and $2 \times 10^{10}$ atoms/cm$^2$ when the impurity concentration of the N-type base layer is $1.3 \times 10^{14}$ atoms/cm$^3$ and $5 \times 10^{14}$ atoms/cm$^3$ respectively.

FIG. 2 represents the results obtained when the amount Q of impurities per unit area of the other or N-type emitter layer is $4 \times 10^{16}$ atoms/cm$^2$. However, the value of Q in the outher or N-type emitter layer may be changed although its lower limit is $4 \times 10^{15}$ atoms/cm$^2$. The inventors have ascertained that such a change in the value of Q in the N-type emitter layer does not provide any influence to the on-state voltage of the thyristor within the scope of the present invention since, in such a case, the on-state voltage in the range of the value of Q of more than $1 \times 10^{15}$ atoms/cm$^2$ in the P-type emitter layer described with reference to FIG. 2 is merely subject to a change.

In conventional thyristors of this kind, the impurity concentration of each of the two emitter layers has been selected to be considerably high from the standpoint of providing satisfactory ohmic contact of the electrodes with the emitter layers so as to minimize the voltage drop in the contact areas and from the standpoint of increasing the carrier injection efficiency of the emitter layers to permit injection of many carriers into the base layers so as to minimize the voltage drop in the base layers. For example, the mean impurity concentration of the N-type emitter layer has been commonly selected to be more than $1 \times 10^{20}$ atoms/cm$^3$, and that of the P-type emitter layer has been commonly selected to be more than $1 \times 10^{18}$ atoms/cm$^3$. For the sake of reference, these impurity concentrations will be expressed in terms of the amount Q of impurities per unit area of the emitter layers. The amount Q of impurities per unit area of the N-type emitter layer is calculated to be $1 \times 10^{17}$ atoms/cm$^2$ since the thickness thereof is at least $10\mu$, and the amount Q of impurities per unit area of the P-type emitter layer is calculated to be $3 \times 10^{15}$ atoms/cm$^2$ since the thickness thereof is at least $30\mu$. It is apparent that these amounts are remarkably greater than those in the thyristor of the present invention. It will thus be seen that the thyristor according to the present invention has an on-state voltage lower than that of conventional thyristors of this kind due to the fact that the amount Q of impurities per unit area of one of the emitter layers is greatly decreased compared with that of the conventional thyristors.

Various methods may be employed to provide the emitter layer having a small amount Q of impurites per unit area. These methods include (1) vapor phase diffusion, (2) deposition of an oxide layer containing an impurity on a semiconductor substrate and diffusion of the impurity from the oxide layer into the semiconductor substrate, (3) deposition of a polycrystalline semiconductor layer containing an impurity on a semiconductor substrate and diffusion of the impurity from the polycrystalline semiconductor layer into the semiconductor substrate, and (4) ion implantation. Among these methods, the impurity diffusion method utilizing the polycrystalline semiconductor layer and the ion implantation method are suitable for forming the emitter layer having a small amount Q of impurities per unit area in the present status of the semiconductor making techniques. The method utilizing the polycrystalline semiconductor layer is especially suitable for the practice of the present invention in that the electrodes can be easily deposited.

Preferred embodiments of the novel thyristor according to the present invention will now be described in detail with reference to FIGS. 3 to 9.

Figure 3:
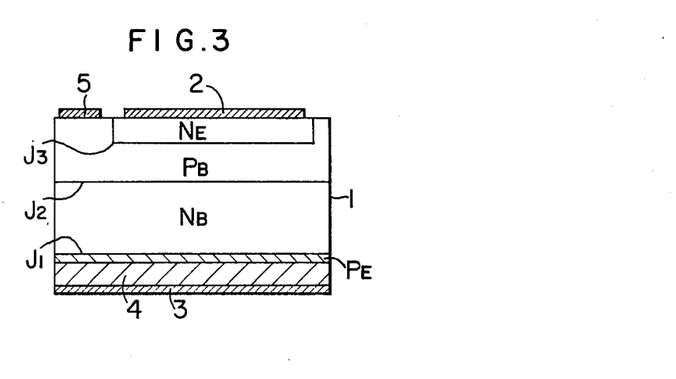
FIG. 3 is a schematic sectional view of a first embodiment of the thyristor according to the present invention.

FIG. 3 is a schematic sectional view of a first embodiment of the thyristor according to the present invention. Referring to FIG. 3, the thyristor comprises a four-layer semiconductor substrate 1 of PNPN structure consisting of an N-type emitter layer $N_E$, a P-type base layer $P_B$, an N-type base layer $N_B$ and a P-type emitter layer $P_E$, a cathode 2 in ohmic contact with the N-type emitter layer $N_E$, an anode 3 in ohmic contact with the P-type emitter layer $P_E$ through a polycrystalline semiconductor layer 4, and a gate 5 in ohmic contact with the P-type base layer $P_B$.

The thyristor of the above structure is fabricated by a process as described below. The starting material is a monocrystalline substrate of N-type silicon refined by the floating zone method and having a resistivity of about 40 $\Omega$-cm and a thickness of $240\mu$. This silicon substrate is placed in a sealed quartz tube together with a P-type dopant which may be gallium and is subjected to heat treatment for about 2 hours at 1,150° C. to form thin P-type layers of high impurity concentration in the opposite surfaces of the N-type silicon substrate. After taking the silicon substrate out of the quartz tube, the P-type layer in one of the surfaces of the N-type silicon substrate is removed by any suitable known method, for example, etching, and then a P-type base layer $P_B$ is formed by carrying out drive-in impurity diffusion for about 20 hours at 1,250° C. utilizing the remaining P-type layer as an impurity source.

The silicon oxide film formed during the step of drive-in impurity diffusion is partly removed using the known photo-etching technique, and a material such as POCl$_3$ acting as a source of an N-type dopant such as phosphorus is heated for about 30 minutes at 1,100° C. to deposit phosphorus on the exposed area of the P-type base layer $P_B$. The phosphosilicate glass produced in the above step is removed by etching with hydrofluoric acid, and then drive-in impurity diffusion is carried out for about 7 hours at 1,200° C. to form an N-type emitter layer $N_E$ in which the amount Q of impurities per unit area is $6.8 \times 10^{16}$ atoms/cm$^2$.

This silicon substrate is then placed in a sealed quartz tube together with gallium again to increase the surface impurity concentration of the P-type base layer $P_B$. The thin P-type layer formed in the above step in the other surface of the silicon substrate opposite the surface having the N-type emitter layer $N_E$ is then removed by etching to obtain an NPN structure. In the NPN structure thus obtained, the N-type emitter layer $N_E$, P-type base layer $P_B$ and N-type base layer $N_B$ had respective thicknesses of $15\mu$, $30\mu$ and $170\mu$.

A polycrystalline silicon layer 4 containing boron as a P-type dopant is then epitaxially grown from a vapor phase on the other surface of the silicon substrate opposite the surface having the N-type emitter layer $N_E$. The source of polycrystalline silicon is trichlorosilane, and the source of boron is diborane. The step of epitaxial growth is carried out for about 25 minutes at 950° C. in a hydrogen atmosphere to attain epitaxial growth of the polycrystalline silicon layer 4 having a thickness of $26\mu$. In this step, boron is diffused into the monocrystalline silicon layer from the polycrystalline silicon layer 4 to form a P-type emitter layer $P_E$. The amount Q of impurities per unit area of this P-type emitter layer $P_E$ was $2.6 \times 10^{12}$ atoms/cm$^2$. Finally, a cathode 2, an anode 3 and a gate 5 were deposited to complete the thyristor shown in FIG. 3.

The electrical properties of the thyristor thus obtained were measured. The forward blocking voltage and reverse blocking voltage of the thyristor were 1,050 volts and 1,100 volts respectively, and the on-state voltage at a current density of 100 A/cm$^2$ was 0.92 volts. A conventional thyristor was fabricated to compare the electrical properties of the thyristor of the present invention with those of the conventional one. In this conventional thyristor, the polycrystalline silicon layer 4 in FIG. 3 was eliminated, and the P-type emitter layer $P_E$ had a thickness of $45\mu$ and a mean impurity concentration of $2 \times 10^{18}$ atoms/cm$^3$. The forward blocking voltage and reverse blocking voltage of this conventional thyristor were 1,000 volts and 1,100 volts respectively, and the on-state voltage at a current density of 100 A/cm$^2$ was 1.09 volts.

It will thus be apparent that the on-state voltage of the thyristor shown in FIG. 3 can be reduced by 15.6% compared with the conventional thyristor. In the embodiment shown in FIG. 3, the forward blocking voltage could be improved in addition to the reduction in the on-state voltage. This is because, in the thyristor of the present invention, the carrier injection efficiency of the P-type emitter layer $P_E$ is lowered and the current amplification factor of the PNP transistor portion is reduced due to the less amount of impurities per unit area of the P-type emitter layer $P_E$ than the conventional one, with the result that a higher forward voltage is required to satisfy the turn-on condition of the thyristor.

In the thyristor of the present invention shown in FIG. 3, the P-type emitter layer $P_E$ is formed by diffusing an impurity from the polycrystalline silicon layer as above described. (In lieu of the P-type emitter layer $P_E$, the N-type emitter layer $N_E$ may be similarly formed). The thyristor of the present invention comprising such P-type emitter layer $P_E$ provides the following advantages:

(1) The P-type emitter layer $P_E$ containing the small amount Q of impurities per unit area can be formed with good reproducibility. In other words, the impurity concentration of the P-type emitter layer $P_E$ is determined by the impurity concentration of the polycrystalline silicon layer, and the impurity concentration of the polycrystalline silicon layer is determined by the impurity concentration of the gas used for doping during the epitaxial growth of the polycrystalline silicon layer. The polycrystalline silicon layer of any desired impurity concentration can thus be obtained with good reproducibility by controlling the impurity concentration of the gas used for doping. Therefore, the P-type emitter layer $P_E$ can be easily formed compared with the diffusion method or alloying method.

(2) The electrode or anode 3 can be easily brought into ohmic contact with the P-type emitter layer $P_E$. Satisfactory ohmic contact is difficult to provide when a layer to be brought into contact with an electrode has a low impurity concentration. However, in the case of the embodiment shown in FIG. 3, the electrode is deposited on the polycrystalline silicon layer which permits satisfactory ohmic contact between the P-type emitter layer $P_E$ and the electrode metal. Thus, satisfactory ohmic contact can be provided between the P-type emitter layer $P_E$ and the electrode although the impurity concentration of the P-type emitter layer $P_E$ is considerably low. The electrode metal is preferably one which contains essentially chromium, molybdenum or tungsten.

Figure 4:
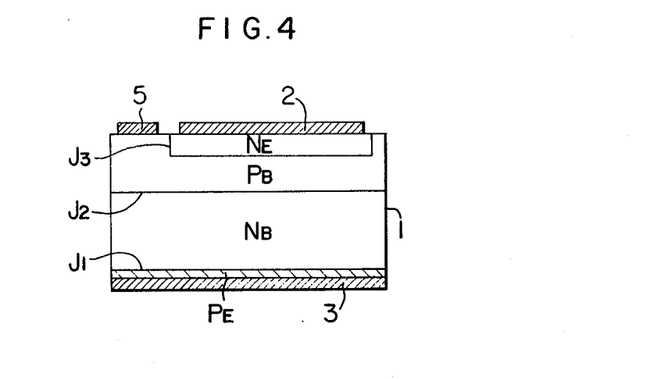
FIG. 4 is a schematic sectional view of a second embodiment of the thyristor according to the present invention.

FIG. 4 shows in schematic sectional fashion a second embodiment of the thyristor of the present invention fabricated utilizing the known ion implantation technique.

Referring to FIG. 4, the starting material is a monocrystalline substrate of N-type silicon having a resistivity of about 50 Ω-cm and a thickness of 215μ. A P-type dopant which may be boron is diffused into one of the surfaces of the silicon substrate to form a P-type base layer $P_B$ and a PN junction $J_2$. An N-type dopant which may be phosphorus is then selectively diffused into the P-type base layer $P_B$ in known manner to form an N-type emitter layer $N_E$ and another PN junction $J_3$. The N-type base layer $N_B$, P-type base layer $P_B$ and N-type emitter layer $N_E$ have respective thicknesses of 170μ, 30μ and 15μ.

Boron in ion form is then implanted into the other surface of the silicon substrate to form a P-type emitter layer $P_E$ and another PN junction $J_1$. This P-type emitter layer $P_E$ has, for example, an impurity concentration of $3 \times 10^{17}$ atoms/cm$^3$ and a thickness of 0.2μ. The impurity concentration of this P-type emitter layer $P_E$ and the depth of the PN junction $J_1$ can be suitably controlled by changing the amount of implanted boron ions and the energy of implantation. In the embodiment shown in FIG. 4, the amount Q of impurities per unit area of the P-type emitter layer $P_E$ was $6 \times 10^{12}$ atoms/cm$^2$, and the on-state voltage of a current density of 100 A/cm$^2$ was 0.92 volts.

The thyristor shown in FIG. 4 differs from that shown in FIG. 3 in the manner of forming the P-type emitter layer $P_E$ in which the amount Q of impurities per unit area is considerably less than heretofore. That is, the P-type emitter layer $P_E$ in FIG. 4 is formed by means of ion implantation, whereas that in FIG. 3 is formed by means of impurity diffusion from the polycrystalline layer 4. The embodiment shown in FIG. 4 is advantageous over that shown in FIG. 3 in that the desired thickness and impurity concentration of the P-type emitter layer $P_E$ can be obtained with good reproducibility, and the layer $P_E$ of desired pattern can be formed with high precision.

The thyristor structures shown in FIG. 3 and 4 are advantageous over conventional ones in that the PNP transistor portion has a low current amplification factor and the dv/dt capability for the applied forward voltage is improved, and that the reduction in the amount of carriers injected into the N-type base layer $N_B$ results in a short turn-off time, due to the fact that the amount Q of impurities per unit area of the P-type emitter layer $P_E$ is considerably less than heretofore.

Figure 5:
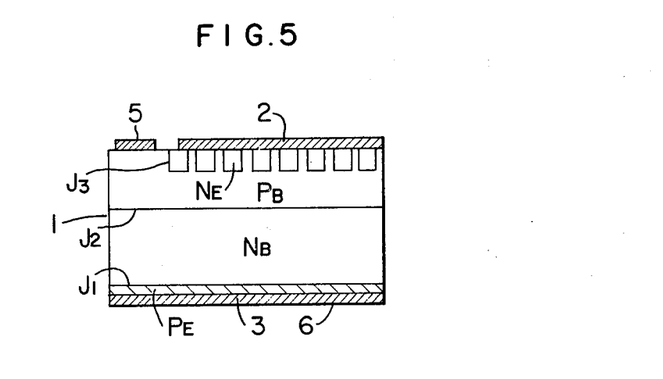
FIG. 5 is a schematic sectional view of a third embodiment of the thyristor according to the present invention.
Figure 6:
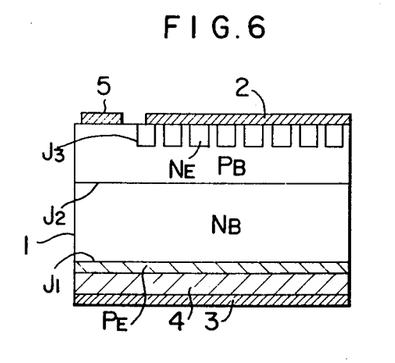
FIG. 6 is a schematic sectional view of a fourth embodiment of the thyristor according to the present invention.

FIGS. 5 and 6 show a third embodiment and a fourth embodiment respectively of the present invention. Actually, the embodiments shown in FIGS. 5 and 6 are partial modifications of those shown in FIGS. 4 and 3 respectively, and differ from the latter in that the N-type emitter layer $N_E$ is of shorted-emitter structure. The thyristor structures shown in FIGS. 5 and 6 are effective in maintaining a high dv/dt capability even when the amount Q of impurities per unit area of the P-type emitter layer $P_E$ is more than those in the first and second embodiments, and the current amplification factor of the PNP transistor portion is increased.

Figure 7:
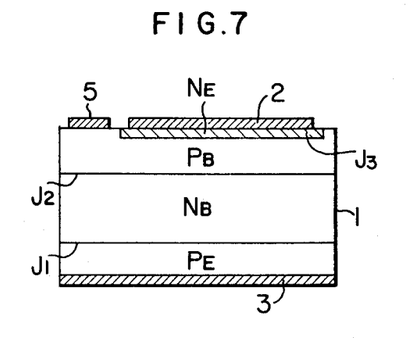
FIG. 7 is a schematic sectional view of a fifth embodiment of the thyristor according to the present invention.

FIG. 7 shows in schematic sectional fashion a fifth embodiment of the thyristor according to the present invention, in which the amount of impurities per unit area of the N-type emitter layer is decreased instead of the P-type emitter layer.

Referring to FIG. 7, the starting material is a monocrystalline substrate of N-type silicon having a resistivity of about 40 Ω-cm and a thickness of 230μ. A P-type dopant which may be boron is diffused into the opposite surfaces of the silicon substrate to provide a PNP structure, and then boron of high concentration is diffused into one of the substrate surfaces. Thus, a P-type emitter layer $P_E$, an N-type base layer $N_B$ and a P-type base layer $P_B$ are formed and have respective thicknesses of 30μ, 170μ and 30μ. An N-type dopant which may be phosphorus is then implanted into the other substrate surface to form an N-type emitter layer $N_E$. In this case, impurity diffusion from a polycrystalline silicon layer may be utilized for forming this N-type emitter layer $N_E$. The formation of the N-type emitter layer $N_E$ by impurity diffusion is attained by forming an oxide film on the substrate surface except the portion providing the N-type emitter region, depositing a polycrystalline silicon layer on the substrate surface, and then removing the unnecessary portion of the polycrystalline silicon layer in a known manner, for example, by etching.

In the embodiment shown in FIG. 7, Q represents the amount of impurities per unit area of the N-type emitter layer $N_E$. When the amount Q of impurities per unit area of the N-type emitter layer $N_E$ was selected to be $3.6 \times 10^{12}$ atoms/cm$^2$, the on-state voltage at a current density of 100 A/cm$^2$ was 0.97 volts. In the case of the embodiment shown in FIG. 7 in which the amount Q of impurities per unit area of the N-type emitter layer $N_E$ is decreased compared with the prior art value, the on-state voltage becomes slightly greater than those in the embodiments shown in FIGS. 3, 4, 5 and 6 in which the amount Q of impurities per unit area of the P-type emitter layer $P_E$ is decreased compared with the prior art value. However, the range of the value of Q in which the merit of the present invention appears is the same for both cases, that is, for the case in which the amount of impurities per unit area of the P-type emitter layer $P_E$ is decreased and for the case in which the amount of impurities per unit area of the N-type emitter layer $N_E$ is decreased.

Although the formation of the P-type base layer by means of impurity diffusion has been referred to in the foregoing description, it is apparent that this P-type base layer may be formed by means of epitaxial growth. In such a case too, the notable merit of the present invention is also exhibited. The epitaxial growth of the P-type base layer is advantageous in that the thyristor characteristics including the on-state voltage and gate sensitivity can be controlled as desired due to the fact that the thickness and impurity concentration of the P-type base layer can be controlled with high precision or with a good yield rate.

Figure 8:
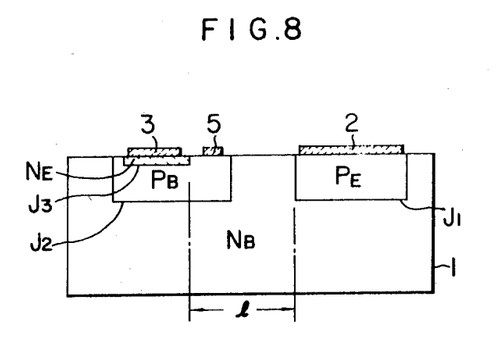
FIG. 8 is a schematic sectional view of a sixth embodiment of the thyristor according to the present invention.

FIG. 8 is a schematic sectional view of a sixth embodiment of the present invention and illustrates an application of the present invention to a thyristor of lateral structure.

Referring to FIG. 8, a P-type dopant which may be boron is selectively diffused into one of the surfaces of a monocrystalline substrate of N-type silicon to form a P-type emitter layer $P_E$ and a P-type base layer $P_B$ forming respective PN junctions $J_1$ and $J_2$ with an N-type base layer $N_B$. An N-type dopant which may be phosphorus is then selectively implanted into the P-type base layer $P_B$ to form an N-type emitter layer $N_E$ having a small amount Q of impurities per unit area. Alternatively, such N-type emitter layer $N_E$ is formed by selectively depositing a polycrystalline silicon layer containing phosphorus, and diffusing the impurity into the P-type base layer $P_B$ utilizing the polycrystalline silicon layer as a source of impurity diffusion. In this case, the thickness of the base layers $P_B$ and $N_B$ is given by the distance 1 between the emitter layers $P_E$ and $N_E$.

Figure 9:
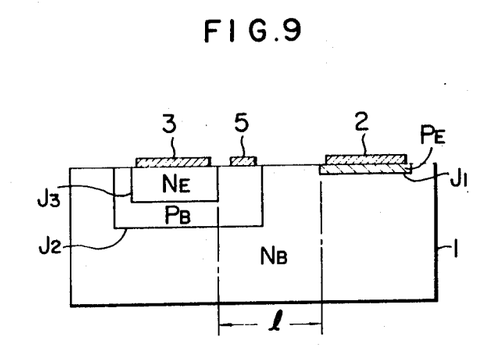
FIG. 9 is a schematic sectional view of a seventh embodiment of the thyristor according to the present invention.

FIG. 9 is a schematic sectional view of a seventh embodiment of the present invention and illustrates another application of the present invention to a thyristor of lateral structure.

Referring to FIG. 9, a P-type base layer $P_B$ and an N-type emitter layer $N_E$ are formed in a monocrystalline substrate of N-type silicon by means of impurity diffusion, and then, a P-type emitter layer $P_E$ having a small amount Q of impurities per unit area is formed by means of impurity ion implantation or impurity diffusion from a polycrystalline silicon layer. The embodiment shown in FIG. 9 can exhibit the merit of the present invention similar to that exhibited by the embodiment shown in FIG. 8.

Although the present invention has been described with reference to the employment of a substrate of N-type silicon, by way of example, it is apparent that the merit of the present invention can also be exhibited even when a substrate of P-type silicon is employed and the relation between the P-type and N-type layers is reversed in the aforementioned embodiments. Further, the merit of the present invention is not affected in any way by the form of the gate trigger means. Thus, the gate may be triggered by means applying an optical signal, a mechanical signal, an electromagnetic signal or any other suitable signal, in lieu of the means applying the electrical signal to the gate.

It will be understood from the foregoing detailed description of the present invention that the amount Q of impurities per unit area of one of the emitter layers of a thyristor is decreased to less than hitherto so that the on-state voltage or forward voltage drop in the thyristor in on-state can be reduced to a level which cannot be achieved in prior art thyristors.

We claim:

1. A thyristor comprising:
   a semiconductor substrate consisting of a first semiconductor layer of one conductivity type, a second semiconductor layer of the other conductivity type contiguous to said first semiconductor layer and defining a first PN junction between it and said first semiconductor layer, a third semiconductor layer of said one conductivity type contiguous to said second semiconductor layer and defining a second PN junction between it and said second semiconductor layer, and a fourth semiconductor layer of said the other conductivity type contiguous to said third semiconductor layer and defining a third PN junction between it and said third semiconductor layer, the regions of said second and third semiconductor layers having a higher resistivity than those of said first and fourth semiconductor layers, the sum of the thicknesses of said second and third semiconductor layers in a direction from said first layer toward said fourth layer being less than 400μ, the amount of impurities per unit area of said first semiconductor layer being less than that of said fourth semiconductor layer and selected to be less than $2 \times 10^{13}$ atoms/cm$^2$ but more than a minimum required for the thyristor operation;
   a first main electrode connected electrically to the surface of said first semiconductor layer;
   a second main electrode in ohmic contact with the surface of said fourth semiconductor layer; and
   the regions of said semiconductor substrate between said first and second main electrodes being adapted to be triggered to switchover from a non-conductive state to a conductive state.

2. A thyristor as claimed in claim 1, wherein the triggering is effected electrically.

3. A thyristor as claimed in claim 1, wherein the triggering is effected optically.

4. A thyristor comprising:
   a semiconductor substrate having a first major surface and a second major surface opposite to each other and consisting, between said first and second major surfaces, of a first semiconductor layer of one conductivity type, a second semiconductor layer of the other conductivity type contiguous to said first semiconductor layer and defining a first PN junction between it and said first semiconductor layer, a third semiconductor layer of said one conductivity type contiguous to said second semiconductor layer and defining a second PN junction between it and said second semiconductor layer, and a fourth semiconductor layer of said the other conductivity type contiguous to said third semiconductor layer and defining a third PN junction between it and said third semiconductor layer, said first major surface being provided at least by the exposed surface of said first semiconductor layer and said second major surface being provided at least by the exposed surface of said fourth semiconductor layer, the regions of said second and third semiconductor layers having a higher resistivity than those of said first and fourth semiconductor layers, the sum of the thicknesses of said second and third semiconductor layers in a direction from said first layer toward said fourth layer being less than 400μ, the amount of impurities per unit area of said first semiconductor layer being less than that of said fourth semiconductor layer and selected to be less than $2 \times 10^{13}$ atoms/cm$^2$ but more than a minimum required for thyristor operation;

a first main electrode connected electrically to the surface of said first semiconductor layer;

a second main electrode in ohmic contact with at least the exposed surface of said fourth semiconductor layer at said second major surface; and the regions of said semiconductor substrate between said first and second main electrodes being adapted to be triggered to switchover from a non-conductive state to a conductive state.

5. A thyristor as claimed in claim 4, wherein the triggering is effected electrically.

6. A thyristor as claimed in claim 4, wherein the triggering is effected optically.

7. A thyristor as claimed in claim 4, comprises a polycrystalline semiconductor layer containing an impurity of said one conductivity type formed on said first semiconductor layer, said first semiconductor layer being formed by diffusion of said impurity from said polycrystalline semiconductor layer.

8. A thyristor as claimed in claim 7, wherein said first main electrode is in ohmic contact with the surface of said polycrystalline semiconductor layer and is provided by a metal containing essentially a metal selected from the group consisting of chromium, molybdenum and tungsten.

9. A thyristor as claimed in claim 4, wherein said one conductivity type is the P-type, and said the other conductivity type is the N-type.

10. A thyristor as claimed in claim 4, wherein said one conductivity type is the N-type, and said the other conductivity type is the P-type.

11. A thyristor as claimed in claim 7, wherein said third semiconductor layer is exposed at said second major surface, and said second main electrode is in ohmic contact with said third semiconductor layer.

* * * * *